United States Patent
Kim (10) Patent No.: US 7,586,373 B2
(45) Date of Patent: Sep. 8, 2009

(54) FULLY DIFFERENTIAL CLASS AB AMPLIFIER AND AMPLIFYING METHOD USING SINGLE-ENDED, TWO-STAGE AMPLIFIER

(75) Inventor: Hyoung Rae Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/924,647

(22) Filed: Oct. 26, 2007

(65) Prior Publication Data
US 2008/0238546 A1 Oct. 2, 2008

(30) Foreign Application Priority Data
Mar. 26, 2007 (KR) ................ 10-2007-0029106

(51) Int. Cl.
*H03F 3/45* (2006.01)
(52) U.S. Cl. .................. 330/257; 330/255; 330/258
(58) Field of Classification Search .......... 330/257, 330/255, 258
See application file for complete search history.

(56) References Cited
U.S. PATENT DOCUMENTS

| | | | | |
|---|---|---|---|---|
| 5,491,455 A | * | 2/1996 | Kuo | ............ 330/253 |
| 5,729,178 A | * | 3/1998 | Park et al. | ............ 330/258 |
| 6,369,745 B1 | * | 4/2002 | Lee et al. | ............ 341/166 |
| 6,642,789 B2 | * | 11/2003 | Ivanov et al. | ............ 330/253 |
| 7,078,970 B2 | | 7/2006 | Ruck | |
| 7,119,616 B2 | * | 10/2006 | Benzer | ............ 330/252 |
| 7,375,585 B2 | * | 5/2008 | Trifonov et al. | ............ 330/258 |

FOREIGN PATENT DOCUMENTS

| | | |
|---|---|---|
| KR | 10-1999-0045303 | 6/1999 |
| KR | 1020040048605 A | 6/2004 |

* cited by examiner

*Primary Examiner*—Patricia Nguyen
(74) *Attorney, Agent, or Firm*—F. Chau & Assoc., LLC (57) ABSTRACT

A fully differential amplifier includes a first single-ended current mirror type fully differential amplifier outputting a first output signal by two stage amplifying a difference between a first input signal and a second input signal and a second single-ended current mirror type fully differential amplifier outputting a second output signal by two stage amplifying a difference between the first input signal and the second input signal. A first tail of the first single-ended current mirror type fully differential amplifier and a second tail of the second single-ended current mirror type fully differential amplifier are connected to each other and the first output signal and the second output signal are differential signals.

10 Claims, 10 Drawing Sheets

FULLY DIFFERENTIAL CLASS AB AMPLIFIER AND AMPLIFYING METHOD USING SINGLE-ENDED, TWO-STAGE AMPLIFIER

CROSS-REFERENCE TO RELATED PATENT APPLICATION

This application claims priority under 35 U.S.C. § 119 from Korean Patent Application No. 2007-0029106, filed on Mar. 26, 2007, the disclosure of which is hereby incorporated by reference in its entirety.

TECHNICAL FIELD

The present disclosure relates to a differential amplifier and, more particularly, to a two-stage fully differential operational transconductance amplifier (OTA).

DISCUSSION OF THE BACKGROUND

As the scale down of CMOS technology continues and the demand for portable electronic products driven by batteries increases, many restricting conditions are generated in the design of very large scale integration (VLSI) devices. Typical restricting conditions are demands for low-voltage operation and low power consumption.

As the trend to use of a system on chip (SOC) device is accelerating, not only digital circuits but also analog circuits are integrated in a single chip. Thus, the analog circuits that are typically less affected by the restricting conditions, as compared to the digital circuits, are now equally affected by the restricting conditions.

A circuit that is most widely used among the analog circuits that can be integrated in a single chip may be an operational amplifier. More specifically, a fully differential class AB amplifier having advantages such as noise immunity, wide output swing, and push-pull operation is widely used.

In general, it is difficult to embody a two-stage amplifier with a high gain, for example, a gain over 80 dB. In order to embody a two-stage amplifier having a high gain, a cascode or folded cascade amplifier or a multi-stage amplifier is used.

Although the folded cascade amplifier is able to provide a high gain, however, it is not appropriate for an application having a low operation voltage due to a voltage headroom. Also, the folded cascade amplifier has a complicated bias circuit so that a circuit area increases.

Since the high-gain amplifier is embodied as a multi-stage device, an increase in the circuit area is unavoidable so that a frequency compensation is difficult. Accordingly, due to the necessity for the frequency compensation using a technology such as a nested miller compensation (NMC) or a multi-path NMC (MNMC), problems such as difficult design and power consumption according to the stage increase are present.

SUMMARY OF THE INVENTION

To solve the above and/or other problems, exemplary embodiments of the present invention provide an amplifier that can provide a high gain, enables a low voltage and low power operation, has a simple frequency compensation and common mode feedback (CMFB) circuit, has a high slew rate, and can be embodied in a small area using a two-stage amplifier.

According to an exemplary embodiment of the present invention, a fully differential amplifier comprises a first single-ended current mirror type fully differential amplifier and a second single-ended current mirror type fully differential amplifier.

The first single-ended current mirror type fully differential amplifier outputs a first output signal by two stage amplifying a difference between a first input signal and a second input signal. The second single-ended current mirror type fully differential amplifier outputs a second output signal by two stage amplifying a difference between the first input signal and the second input signal. A first tail of the first single-ended current mirror type fully differential amplifier and a second tail of the second single-ended current mirror type fully differential amplifier are connected to each other and the first output signal and the second output signal are differential signals.

The fully differential amplifier further comprises a bias control circuit controlling a slew rate of each of the first output signal and the second output signal by controlling an amount of tail current of a first tail during an amplification operation.

The bias control circuit controls the amount of tail current based on currents obtained by mirroring each current flowing in a current mirror of the first single-ended current mirror type fully differential amplification unit and current flowing in a current mirror of the second single-ended current mirror type fully differential amplification unit, by a real number multiple.

The fully differential amplifier further comprises a common mode feedback circuit that controls a common mode voltage of the fully differential amplifier based on results of amplifications of differences between a reference voltage and each of the first and second output signals.

Each of the first and second single-ended current mirror type fully differential amplifiers comprises a single-ended current mirror type differential amplification unit to amplify a difference between the first input signal and the second input signal and a push-pull type amplification unit connected to an output port of the single-ended current mirror type differential amplification unit and outputting any one of the first and second output signals.

The push-pull type amplification unit comprises a first transistor of a first conductive type connected between a power voltage line and an output port of the fully differential amplifier and having a gate connected to the output port of the single-ended current mirror type differential amplification unit, a second transistor of a second conductive type connected between a ground voltage line and the output port of the fully differential amplifier, a third transistor of the second conductive type connected between a first node and the ground voltage line and including a gate connected to a drain and a gate of the second transistor, a fourth transistor of the first conductive type connected between the power voltage line and the first node and including a gate connected to a gate of a current mirror of the single-ended current mirror type differential amplification unit, and a compensation capacitor connected between the output port of the single-ended current mirror type differential amplification unit and the output port of the fully differential amplifier.

The push-pull type amplification unit further comprises a fifth transistor of the second conductive type that is connected between the first tail and the ground voltage line and including a gate connected to a gate of the third transistor of the second conductive type, and the third transistor of the second conductive type and the fifth transistor of the second conductive type form a current mirror having a current ratio of a real number multiple.

According to an exemplary embodiment of the present invention, a method for performing a class AB differential amplification comprises differentially amplifying a difference between a first input signal and a second input signal through a pair of single-ended current mirror type amplifiers respectively having tails connected to each other in parallel, and outputting a first signal and a second signal that is a differential signal of the first signal and outputting a first output signal by amplifying the first signal through a first push-pull up amplification circuit, and outputting a second outputting signal that is a differential signal of the first output signal by amplifying the second signal through a second push-pull up amplification circuit.

The method further comprises controlling a slew rate of each of the first output signal and the second output signal by controlling an amount of a tail current during an amplification operation.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Exemplary embodiments of the present invention now will be described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. In the drawings, like numbers refer to like elements throughout.

Figure 1:
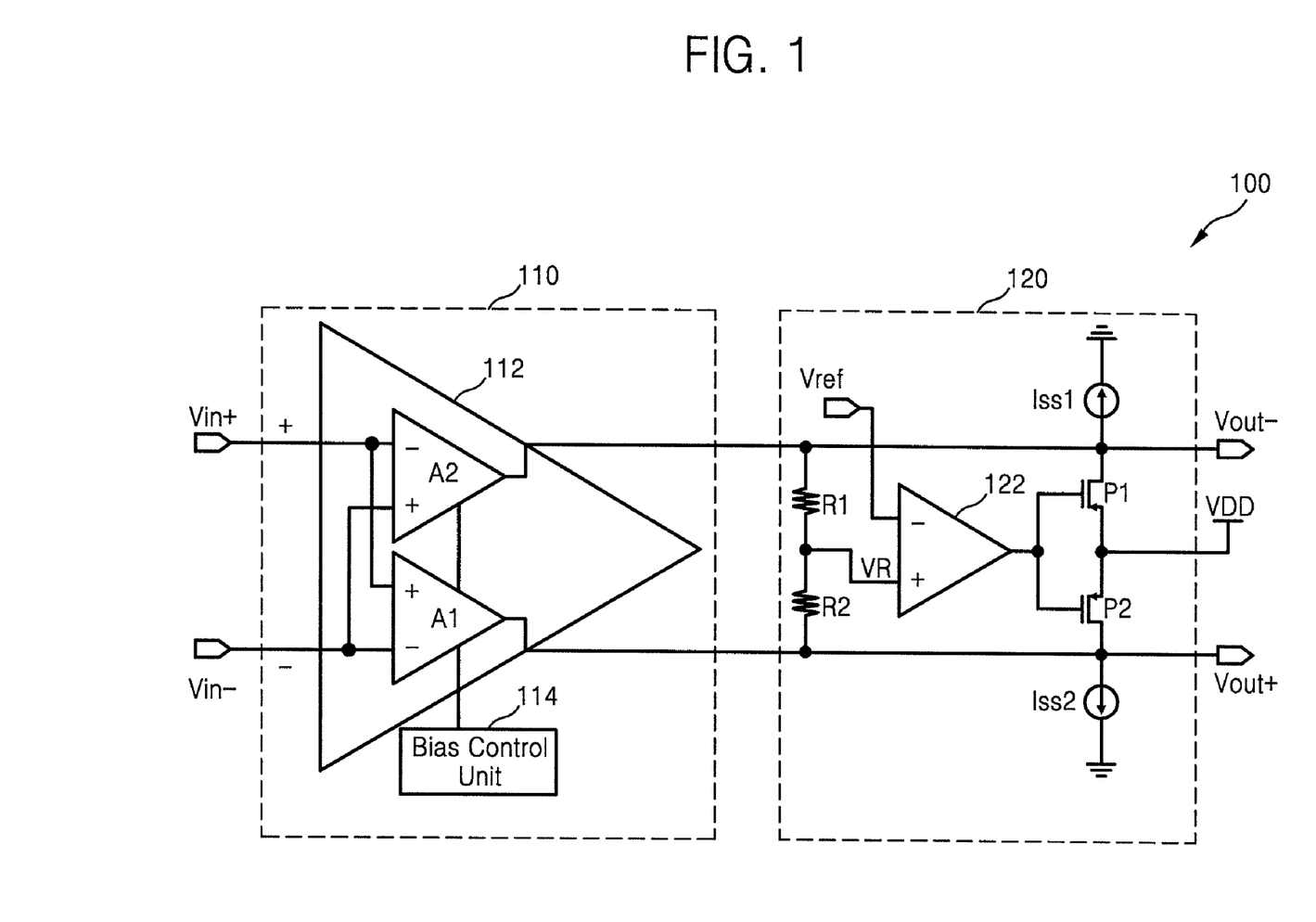
FIG. 1 is a block diagram of a fully differential class AB amplifier according to an exemplary embodiment of the present invention.

FIG. 1 is a block diagram of a fully differential class AB amplifier according to an exemplary embodiment of the present invention. Referring to FIG. 1, the fully differential class AB amplifier 100 includes a fully differential class AB amplification block 110, and a common mode feedback (CMFB) block 120.

The fully differential class AB amplification block 110 includes an amplification unit 112 and a bias control unit 114. The amplification unit 112 includes a first single-ended (current mirror type fully differential) amplifier A1 and a second single-ended (current mirror type fully differential) amplifier A2. The first single-ended amplifier A1 amplifies a difference between a first input signal Vin+ input to a (+) input port and a second input signal Vin− input to a (−) input port and outputs a first output signal Vout+. The second single-ended amplifier A2 amplifies a difference between the first input signal Vin+ input to the (−) input port and the second input signal Vin− input to the (+) input port and outputs a second output signal Vout− that is a differential signal with respect to the first output signal Vout+.

The bias control unit 114 controls a tail current (not shown) of each of the first single-ended amplifier A1 and the second single-ended amplifier A2. The bias control unit 114 can control the slew rate of the first output signal Vout+ and/or the second output signal Vout− by controlling the tail current.

The CMFB block 120 compares a common mode voltage VR of the fully differential class AB amplification block 110 with a reference voltage Vref and controls the first output signal Vout+ and the second output signal Vout− based on a result of the comparison. For example, when a resistance value of a first resistor R1 and a resistance value of a second resistor R2 are the same, the common mode voltage VR can be an average of a voltage of the first output signal Vout+ and a voltage of the second output signal Vout−.

When the common mode voltage VR is smaller than the reference voltage Vref, the output of the comparator 122 is a low level and PMOS transistors P1 and P2 are turned on. As the PMOS transistors P1 and P2 are turned on, the voltage of each of the first output signal Vout+ and the second output signal Vout− increases by reason of the power supply voltage VDD and the current sources ISS1 and ISS2.

Figure 2:
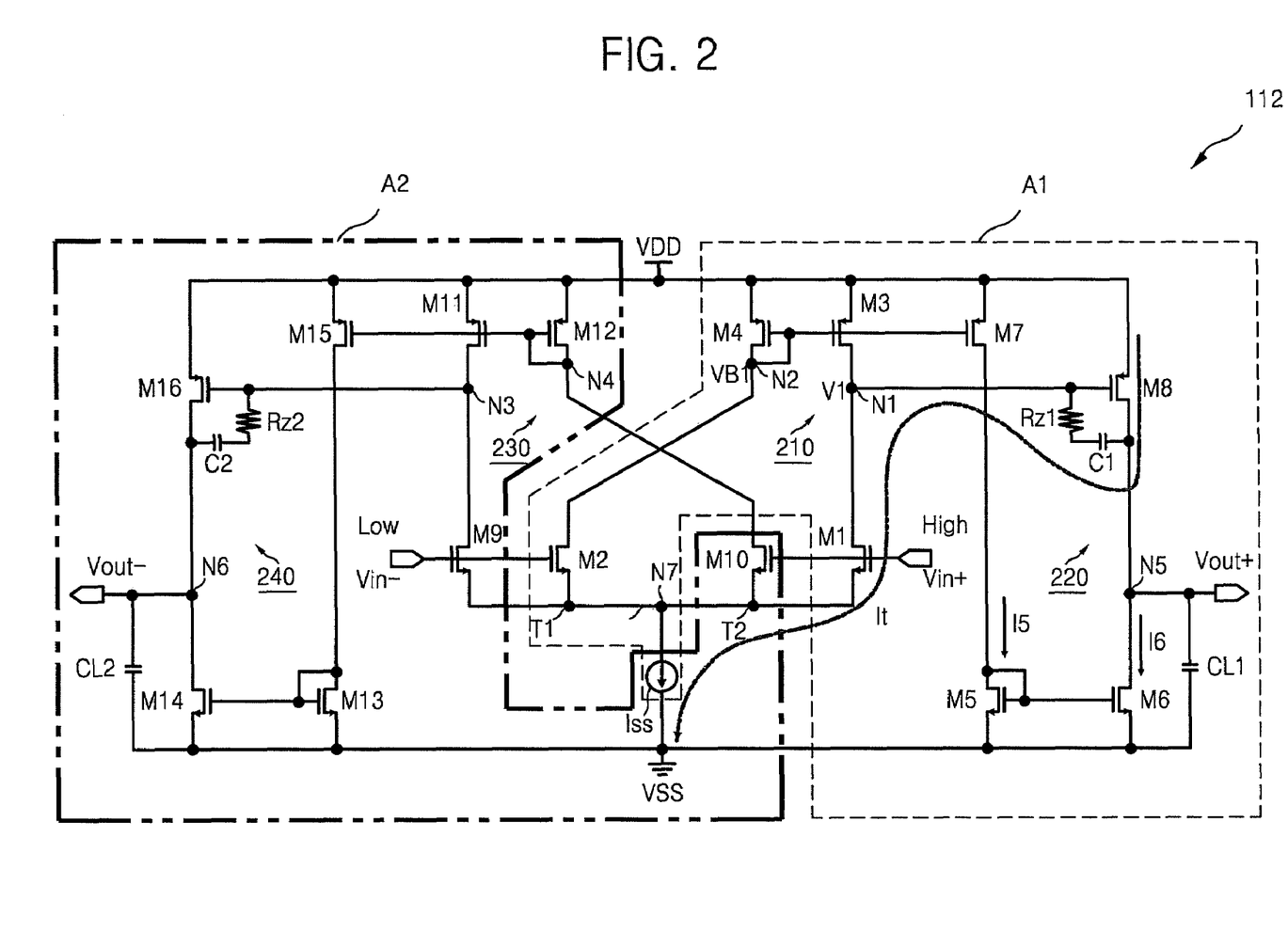
FIG. 2 is a circuit diagram of an exemplary embodiment of the amplification unit illustrated in FIG. 1.

FIG. 2 is a circuit diagram of an exemplary embodiment of the amplification unit 112 illustrated in FIG. 1. Referring to FIG. 2, the amplification unit 112 includes a first single-ended current mirror type fully differential amplifier A1 and a second single-ended current mirror type fully differential amplifier A2.

The first single-ended current mirror type fully differential amplifier A1 includes first through eighth transistors M1, M2, M3, M4, M5, M6, M7, and M8, a first compensation capacitor C1, a first resistor Rz1, and a first load capacitor CL1. The first single-ended current mirror type fully differential amplifier A1 amplifies a difference between the first input signal Vin+ and the second input signal Vin− and outputs the first output signal Vout+.

The second single-ended current mirror type fully differential amplifier A2 includes the ninth through sixteenth transistors M9, M10, M11, M12, M13, M14, M15, and M16, a second compensator capacitor C2, a second resistor Rz1, and a second load capacitor CL2. The second single-ended current mirror type fully differential amplifier A2 amplifies a difference between the first input signal Vin+ and the second input signal Vin− and outputs the second output signal Vout−.

A first tail T1 of the first single-ended current mirror type fully differential amplifier A1 and a second tail T2 of the second single-ended current mirror type fully differential amplifier A2 are connected to each other. The first output signal Vout+ and the second output signal Vout− are differential signals.

The first single-ended current mirror type fully differential amplifier A1 includes a first single-ended current mirror type differential amplification unit (M1-M4) 210 and a first output amplification unit (M5-M8, C1, Rz1, and CL1) 220. The first output amplification unit 220 is connected to an output node N1 of the first single-ended current mirror type differential amplification unit 210 and can be embodied as a push-pull type amplification circuit that outputs the first output signal Vout+.

The second single-ended current mirror type fully differential amplifier A2 includes a second single-ended current mirror type differential amplification unit (M9-M12) 230 and a second output amplification unit (M13-M16, C2, Rz2, and CL2) 240. The second output amplification unit 240 is connected to an output node N3 of the second single-ended current mirror type differential amplification unit 230 and can be embodied as a push-pull type amplification circuit that outputs the second output signal Vout−.

Thus, the amplification unit 112 can perform a fully differential class AB amplification operation. The M1-M16 of FIG. 2 indicate first through sixteenth transistors, and current flowing between a drain and a source of each of the M1-M16 transistors is referred to as first through sixteenth currents I1-I16, although all are not shown in FIG. 2. The first output amplification unit 220 includes the fifth through eighth transistors M5-M8, the first compensation capacitor C1, the first resistor Rz1, and the first load capacitor CL1.

The eighth transistor M8 is connected between a power voltage VDD line and an output node N5 of the amplification unit 112 and includes a gate connected to the output node N1 of the first single-ended current mirror type differential amplification unit 210.

The sixth transistor M6 is connected between the output node N5 of the amplification unit 112 and a ground voltage VSS line. The fifth transistor M5 is connected between the seventh transistor M7 and the ground voltage VSS line. A current mirror is formed by the fifth transistor M5 and the sixth transistor M6. The sixth current I6 flowing through the sixth transistor M6 is a current obtained by mirroring the fifth current I5 flowing through the fifth transistor M5.

The seventh transistor M7 is connected between the power voltage VDD and the fifth transistor M5 and includes a gate connected to a gate of current mirror transistors M3 and M4 included in the first single-ended current mirror type differential amplification unit 210. The compensation capacitor C1 and the first resistor Rz1 are connected in series and are connected between the output node N1 of the first single-ended current mirror type differential amplification unit 210 and the output node N5 of the amplification unit 112.

The second output amplification unit 240 has the same structure as the first output amplification unit 220. As shown in FIG. 2, the transistors M1, M2, M5, M6, M9, M10, M13, and M14 can be NMOS transistors and the transistors M3, M4, M7, M8, M11, M12, M15, and M16 can be PMOS transistors.

When the first input signal Vin+ is a high level and the second input signal Vin− is a low level, the voltage of the first node N1 and the voltage of the fourth node N4 are decreased and the voltages of the second and third nodes N2 and N3 are increased. The first node N1 and the second node N2 are output nodes of the first single-ended current mirror type differential amplification unit 210. The third node N3 and the fourth node N4 are output nodes of the second single-ended current mirror type differential amplification unit 230. The output of the first single-ended current mirror type differential amplification unit 210 is output from the first node N1 and the output of the second single-ended current mirror type differential amplification unit 230 is output from the third node N3.

As the voltage of the first node N1 decreases, the eighth transistor M8 is gradually turned on so that the voltage of the fifth node N5, that is, the voltage of the first output signal Vout+ is gradually increased. As the voltage of the second node N2 increases, the seventh transistor M7 is gradually turned off. Accordingly, the fifth current I5 decreases and the sixth current I6 obtained by mirroring the fifth current I5 also deceases.

Thus, a tail current (It=Iss) flows between the ground voltage VSS line and the seventh node N7 to which the first tail T1 and the second tail T2 are connected, as shown in FIG. 2. On the other hand, as the voltage of the third node N3 is gradually increased, the sixteenth transistor M16 is gradually turned off, so that the voltage of the sixth node N6, that is, the voltage of the second output signal Vout−, is gradually decreased.

A gain Av of the fully differential class AB amplification unit 112 is a value obtained by multiplying the gain Av1 of the first single-ended current mirror type differential amplification unit 210 and a gain Av2 of the first output amplification unit 220. The gain Av1 of the first single-ended current mirror type differential amplification unit 210 is a value obtained by multiplying a transconductance, for example, gm1, of the first transistor M1 and a first synthetic resistance value. The first synthetic resistance value is a resistance value (ro1×ro3/(ro1+ro3)) obtained by synthesizing in parallel an output resistance ro1 of the first transistor M1 and an output resistance ro3 of the third transistor M3.

The gain Av2 of the first output amplification unit 220 is a value obtained by multiplying a transconductance, for example, gm5, of the fifth transistor M5 and a second synthetic resistance value. The second synthetic resistance value is a resistance value (ro5×ro7/(ro5+ro7)) obtained by synthesizing in parallel an output resistance ro5 of the fifth transistor M5 and an output resistance ro7 of the seventh transistor M7. Thus, the amplification unit 112 can have a high gain of over 100 dB.

The slew rate of the first output signal Vout+ is proportional to the tail current Iss and inversely proportional to a capacitance of the first capacitor C1 of the first output amplification unit 220. Thus, in the circuit shown in FIG. 2, when the tail current Iss is constant, the slew rates of the first output signal Vout+ and the second output signal Vout− are constant.

Figure 3:
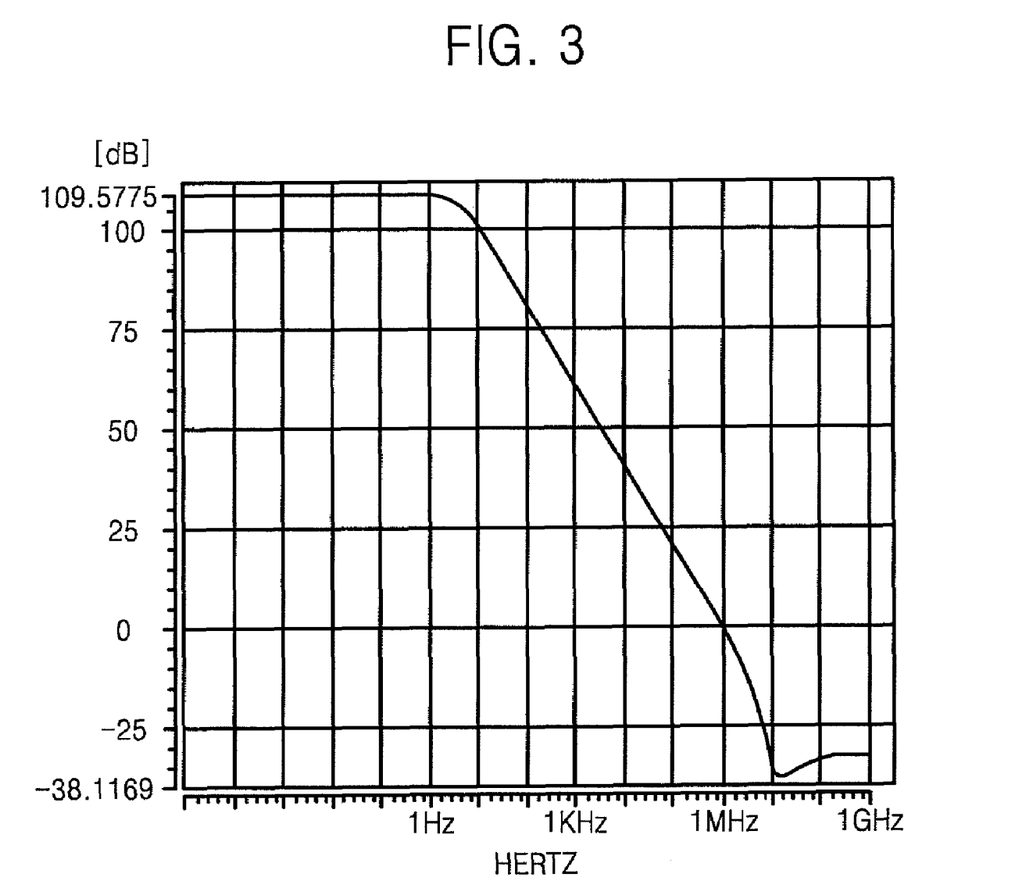
FIG. 3 is a graph showing the AC gain of the amplification unit illustrated in FIG. 2.
Figure 4:
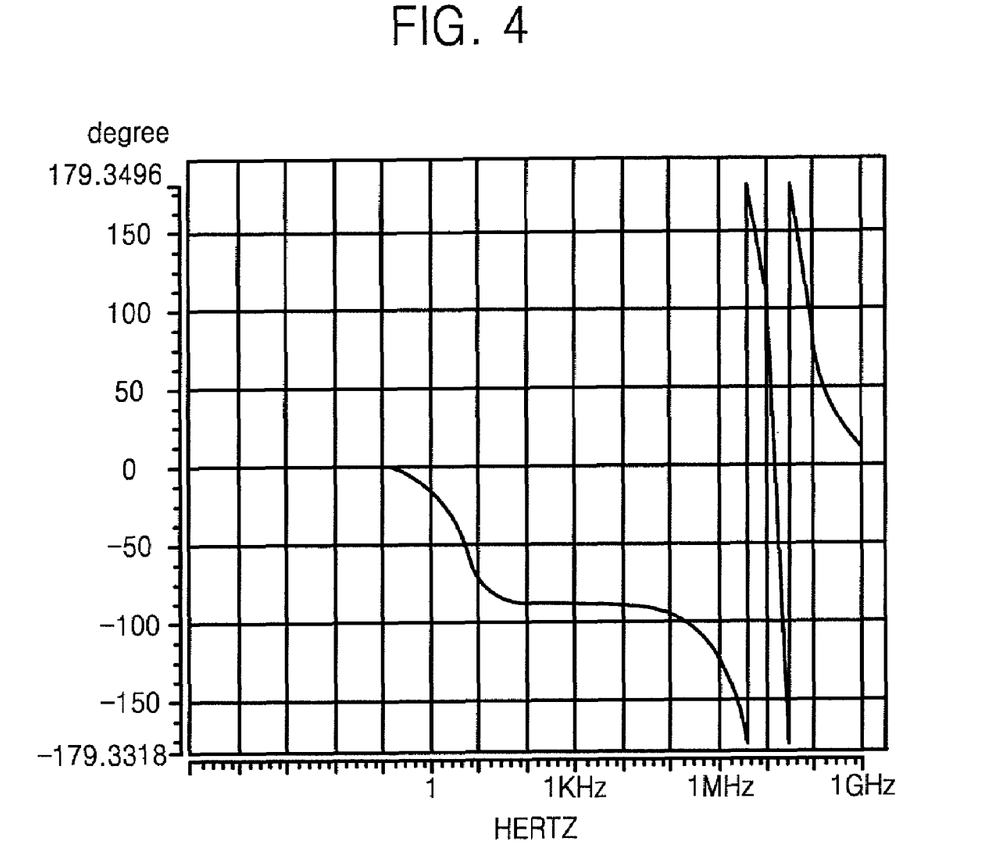
FIG. 4 is a graph showing the phase of an AC gain of the amplification unit illustrated in FIG. 2.

FIG. 3 is a graph showing the AC gain of the amplification unit 112 illustrated in FIG. 2. FIG. 4 is a graph showing the phase of an AC gain of the amplification unit 112 illustrated in FIG. 2. Referring to FIGS. 3 and 4, the AC gain of the amplification unit 112 versus frequency can be a maximum of about 110 dB and becomes 0 dB at a frequency of about 1 MHz. Also, since the phase of the AC gain at 1 MHz is about −120°, as shown in FIG. 4, there can be a phase margin of about 60°.

Figure 5:
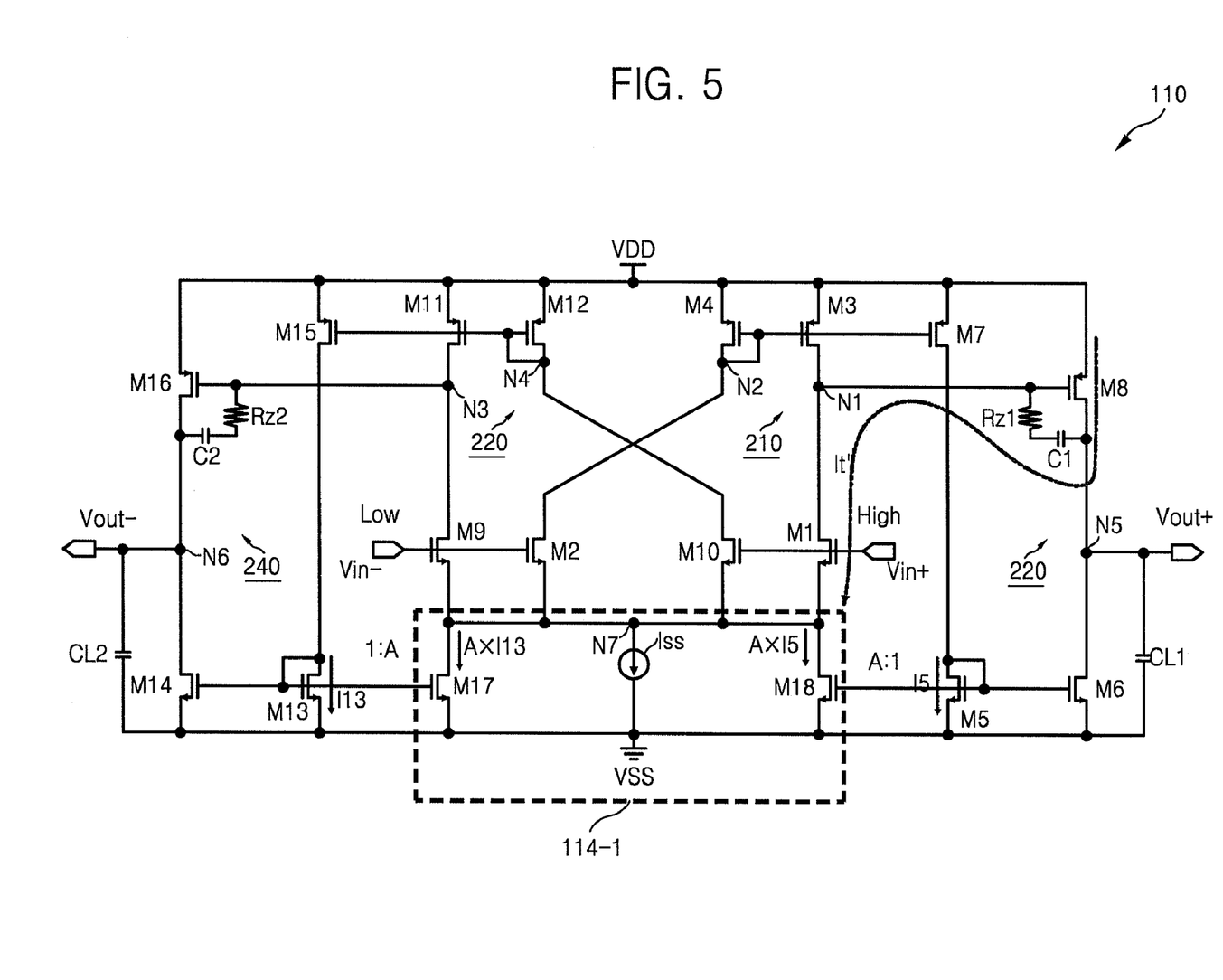
FIG. 5 is a circuit diagram of a fully differential class AB amplification block according to an exemplary embodiment of the present invention.

FIG. 5 is a circuit diagram of a fully differential class AB amplification block according to an exemplary embodiment of the present invention. Referring to FIG. 5, the fully differential class AB amplification block 110 is a circuit in which a first bias control unit 114-1 is added to the amplification unit 112 shown in FIG. 2.

The first bias control unit 114-1 includes a seventeenth transistor M17 and an eighteenth transistor M18. The seventeenth transistor M17 is connected between the seventh node N7 and the ground voltage VSS line and includes a gate connected to a gate of the thirteenth transistor M13. The eighteenth transistor M18 is connected between the seventh node N7 and the ground voltage VSS line and includes a gate connected to a gate of the fifth transistor M5.

Because the thirteenth transistor M13 and the seventeenth transistor M17 form a current mirror as shown in FIG. 5, the current I17 (not shown) flowing between the drain and source of the seventeenth transistor M17 is a current (A×I13) obtained by mirroring the thirteenth current I13 A times. In this exemplary embodiment, the A is a positive real number.

Similarly, the current I18 (not shown) flowing between the drain and source of the eighteenth transistor M18 is a current (A×I5) obtained by mirroring the fifth current I5 A times. Thus, a tail current It' flowing between the seventh node N7 and the ground voltage VSS line is a sum of the current Iss of the current source and the mirrored currents (A×I13 and A×I5).

When the first input signal Vin+ is a high level and the second input signal Vin− is a low level, because the amount of the tail current It' is larger than that of the tail current It of FIG. 2 by the mirrored current (A×I13 and A×I5), the slew rate of each of the output signals Vout+ and Vout− of the amplification block 110 increases.

The fully differential class AB amplification block 110 of FIG. 5 provides a gain of over 100 dB using a two stage amplifier, can be embodied in a small area due to a simple bias circuit, and can increase the slew rates of the output signals.

Figure 6:
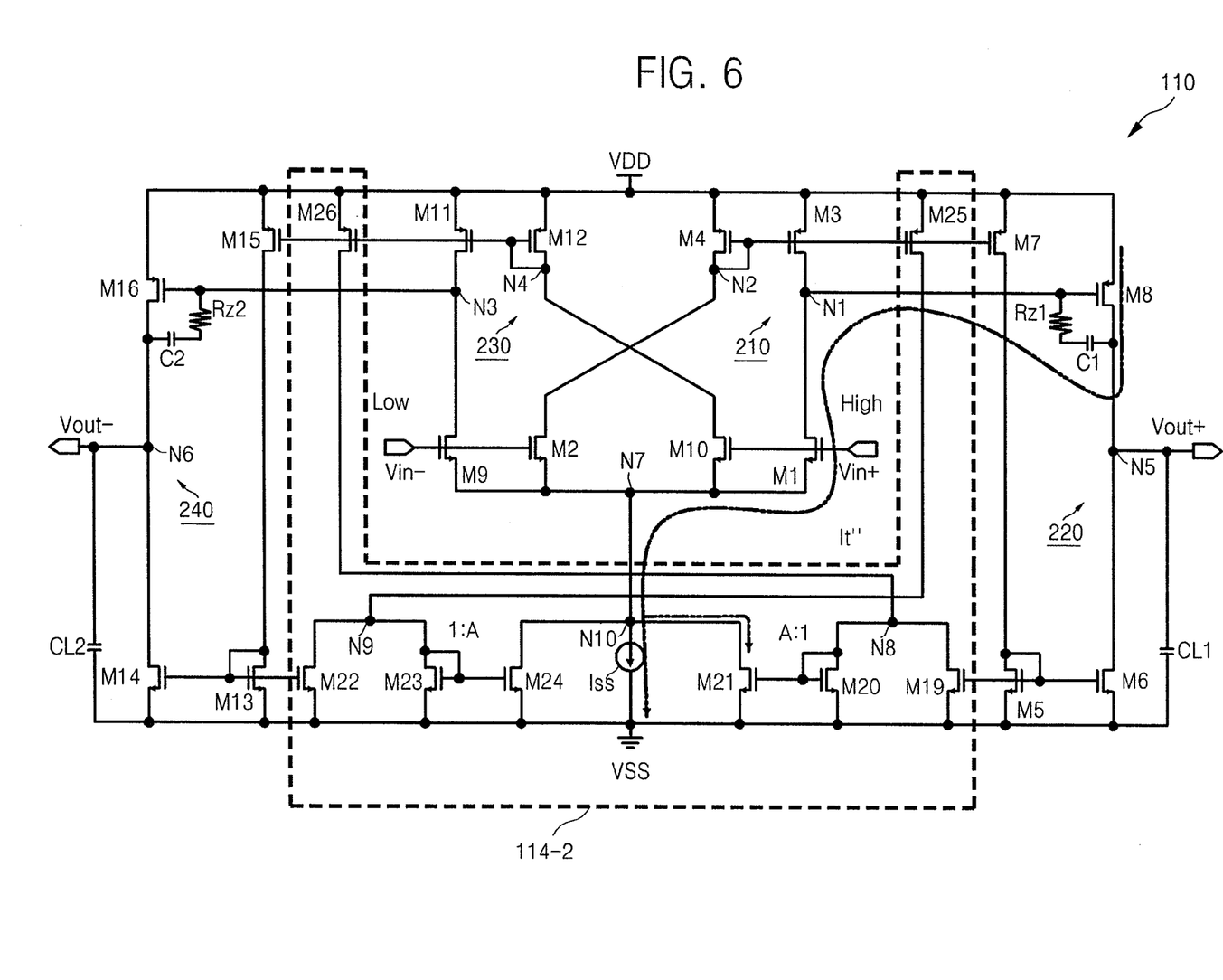
FIG. 6 is a circuit diagram of a fully differential class AB amplification block according to an exemplary embodiment of the present invention.

FIG. 6 is a circuit diagram of a fully differential class AB amplification block according to an exemplary embodiment of the present invention. Referring to FIG. 6, the fully differential class AB amplification block 110 is a circuit in which a bias control unit 114-2 formed of transistors M19 to M26 is added to the amplification unit 112 of FIG. 2. The M19-M26 transistors correspond to the nineteenth transistor through the twenty-sixth transistor. The current flowing between the source and drain of each of the nineteenth transistor through the twenty-sixth transistor is referred to as the nineteenth current through the twenty-sixth current I19-I26 (not shown). The M19-M24 transistors can be NMOS transistors while the M25 and M26 transistors can be PMOS transistors.

The bias control unit 114-2 includes the nineteenth transistor through the twenty-sixth transistor (M19-M26) connected as shown in FIG. 6. The bias control unit 114-2 controls the amount of a tail current It" flowing between the ground voltage VSS and the seventh node N7.

The tail current It" is branched into a twenty-first current I21 (not shown), a twenty-fourth current I24 (not shown), and the current Iss of the current source at the seventh node N7. The twenty-first current I21 is a current obtained by mirroring the twentieth current I20 A times, where the A is a real number. The twenty-fourth current I24 is a current obtained by mirroring the twenty-third current I23 A times.

The twenty-sixth current I26 is branched to the nineteenth current I19 (not shown) and the twentieth current I20 (not shown) at the eighth node N8. The twenty-fifth current I25 is branched to the twenty-second current I22 and the twenty-third current I23 at the ninth node N9. Thus, the twentieth current I20 is a current obtained by subtracting the nineteenth current I19 from the twenty-sixth current I26 (I20=I26-I19). The twenty-third current I23 is a current obtained by subtracting the twenty-second current I22 from the twenty-fifth current I25 (I23=I25−I22).

When the first input signal Vin+ is a high level and the second input signal Vin− is a low level, the twenty-fifth transistor M25 is gradually turned off and the twenty-sixth transistor M26 is gradually tuned on. Thus, the twenty-fifth current I25 (not shown) is gradually decreased while the twenty-sixth current I26 (not shown) is gradually increased.

Since the twenty-sixth current I26 is larger than the twenty-fifth current I25 (not shown), the tail current It" does not flow to the ground voltage VSS line through the twenty-fourth transistor M24. Thus, the tail current It" is branched into the current of the current source Iss and the twenty-first current I21 at the tenth node N10 and flows to the ground voltage VSS line.

When first input signal Vin+ is a high level and the second input signal Vin− is a low level, since the twenty-sixth current I26 is smaller than the twenty-fifth current I25, the tail current It" does not flow to the ground voltage VSS line through the twenty first transistor M21. Thus, the tail current It" is branched into the current Iss of the current source and the twenty-fourth current I24 at the tenth node N10 and flows to the ground voltage VSS line.

When the differential input signals Vin+ and Vin− are input to the fully differential class AB amplification block 110 of FIG. 6, because the amount of the tail current It" varies according to the A value, the slew rate of each of the output signals Vout+ and Vout− of the amplification block 110 is adjustable. For example, as the A value increases, the slew rate of each of the output signals Vout+ and Vout− of the amplification block 110 is improved by also increasing.

Figure 7:
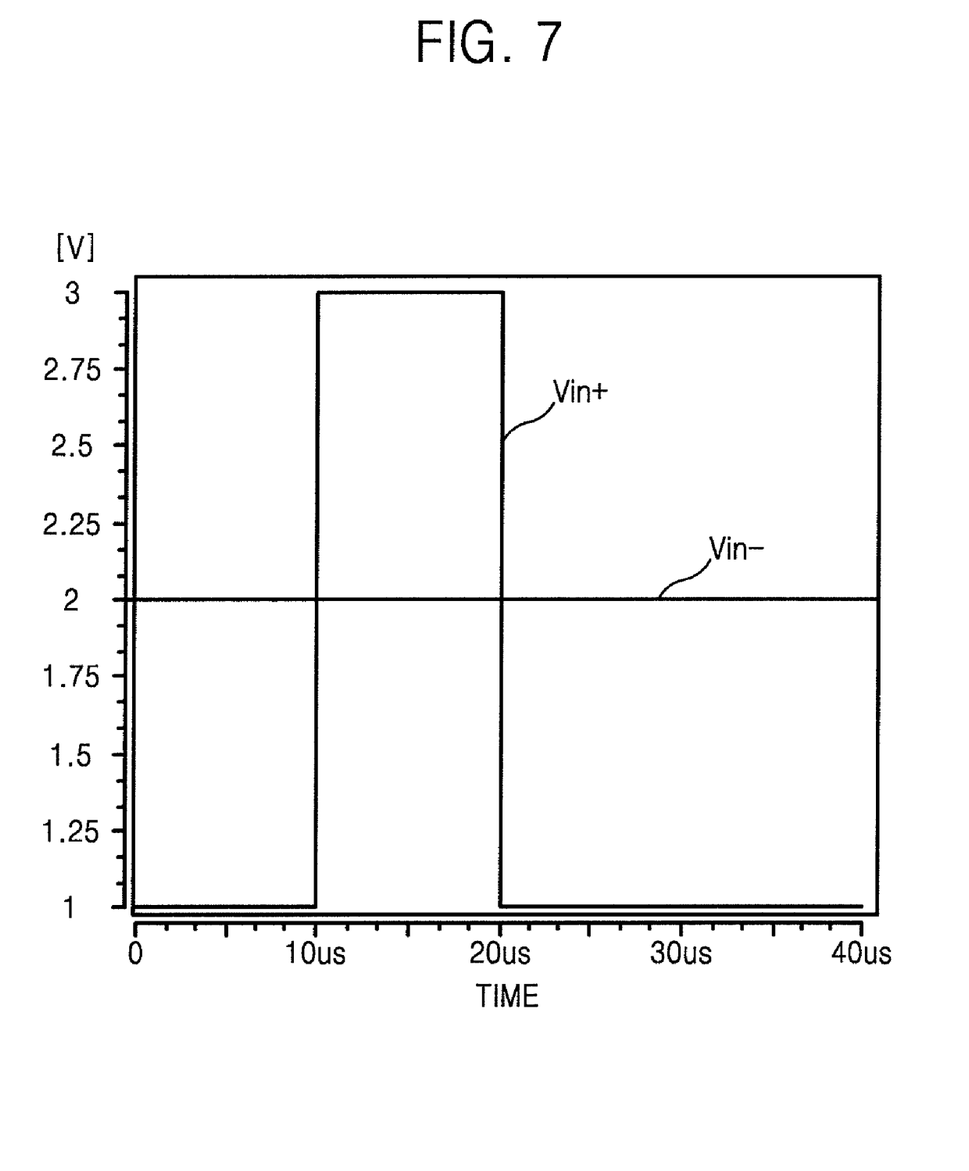
FIG. 7 is a graph showing input signals input to the fully differential class AB amplification block illustrated in FIG. 6.
Figure 8:
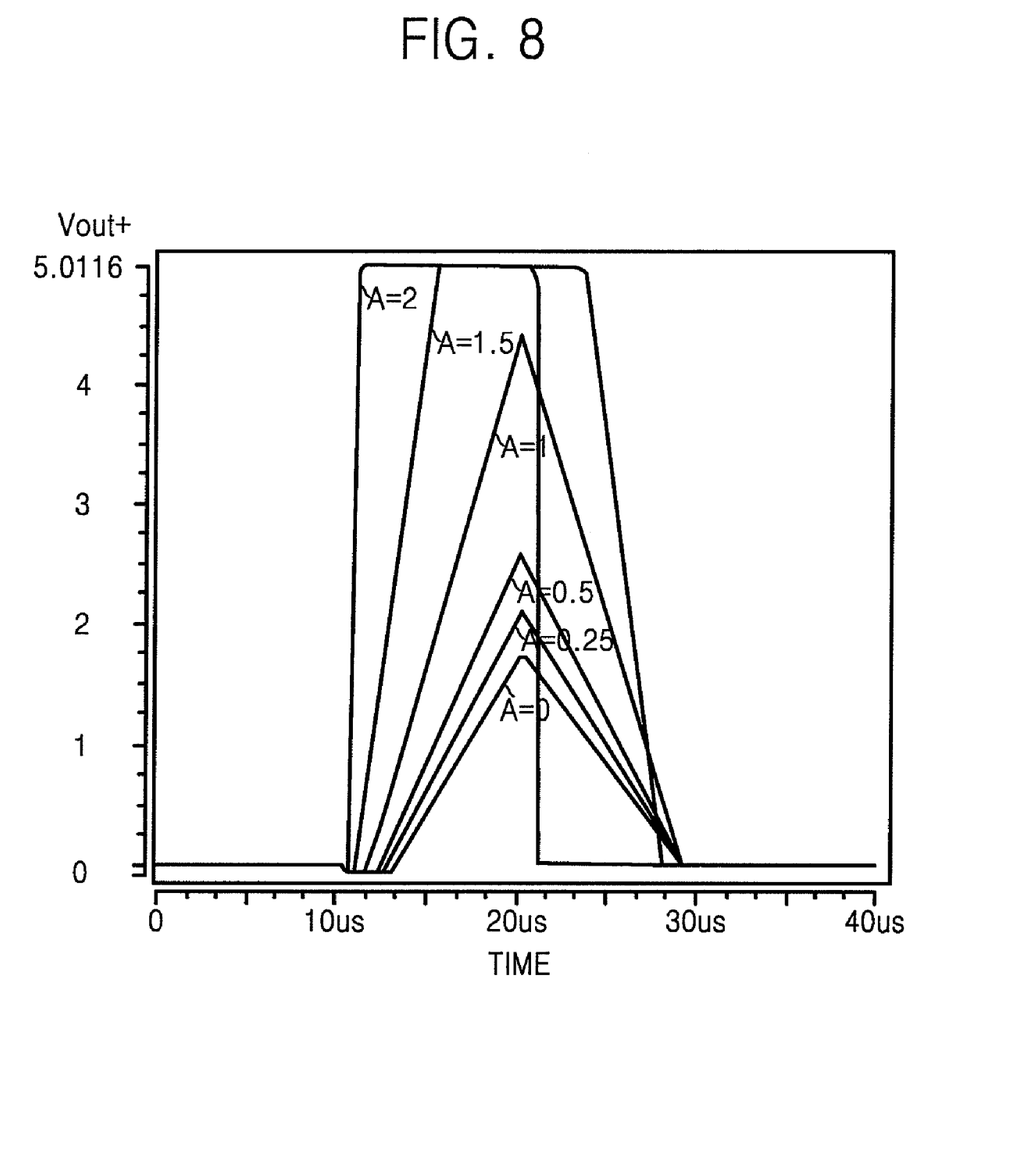
FIG. 8 is a graph showing a slew rate of an output signal of the fully differential class AB amplification block illustrated in FIG. 6 with respect to the input signal illustrated in FIG. 7.

FIG. 7 is a graph showing input signals input to the fully differential class AB amplification block 110 illustrated in FIG. 6, and FIG. 8 is a graph showing a slew rate of output signals of the fully differential class AB amplification block 110 illustrated in FIG. 6, with respect to the input signals illustrated in FIG. 7, for various values of A.

Referring to FIGS. 7 and 8, it will be seen that as the A value increases, the slew rate of the output signal Vout+ of the fully differential class AB amplification block 110 also increases.

Figure 9:
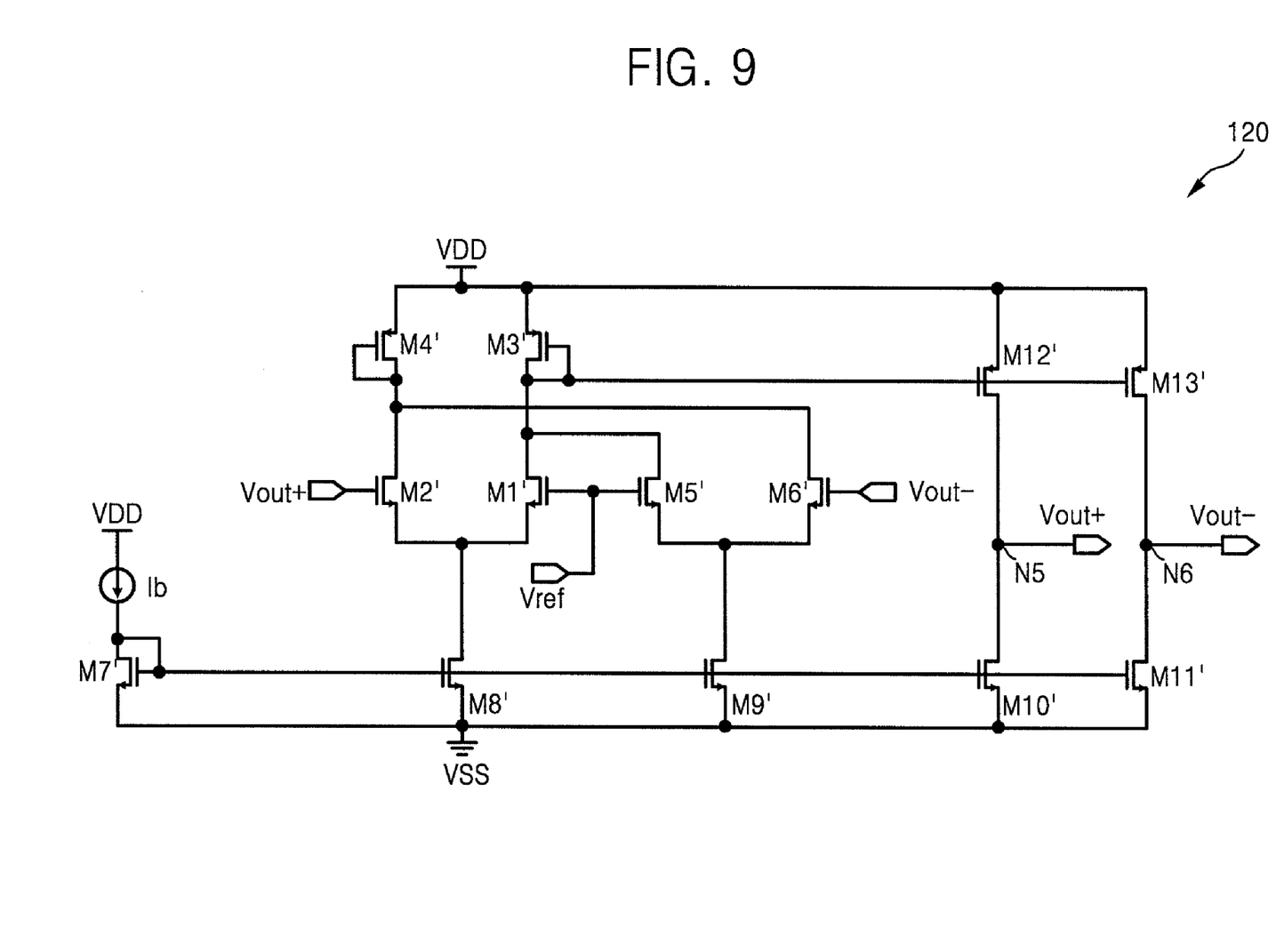
FIG. 9 is an exemplary embodiment of the common mode feedback (CMFB) block illustrated in FIG. 1.

FIG. 9 is an exemplary embodiment of the common mode feedback (CMFB) block 120 used in the amplifier 100 shown in FIG. 1. Referring to FIG. 9, the CMFB block 120 includes a pair of first differential transistors M1' and M2', a pair of second differential transistors M5' and M6', a first load transistor M3', a second load transistor M4', first through fifth bias transistors M7', M8', M9', M10'; and M11', a first output transistor M12', and a second output transistor M13'.

Each of the first differential transistors M1' and M2' can be an NMOS transistor. Output ports of the first differential transistors M1' and M2' are connected to the output ports of the second differential transistors M5' and M6', respectively. The first differential transistors M1' and M2' amplify a difference between the first output signal Vout+ from the amplification block 110 shown in FIG. 1 and the reference voltage Vref. The second differential transistors M5' and M6' amplify a difference between the second output signal Vout− from the amplification block 110 shown in FIG. 1 and the reference voltage Vref.

Each of the first load transistor M3' and the second load transistor M4' can be a PMOS transistor in which a gate and a source are connected to each other and is connected between the power voltage VDD line and a corresponding one of the output ports of the first differential transistors M1' and M2'. Each of the first through fifth bias transistors M7' through M1' can be an NMOS transistor. The first bias transistor M7' has a gate and a source connected to each other and is connected between the power voltage VDD line and the ground voltage VSS line.

The second bias transistor M8' is connected between a tail of the first differential transistors M1' and M2' and the ground voltage VSS line and includes a gate connected to the gate of the first bias transistor M7'. The third bias transistor M9' is connected between a tail of the second differential transistors M5' and M6' and the ground voltage VSS line and includes a gate connected to the gate of the second bias transistor M8'.

The fourth bias transistor M10' is connected between the fifth node N5 and the ground voltage VSS line and includes a gate connected to the gate of the third bias transistor M9'. The fifth bias transistor M11' is connected between the sixth node N6 and the ground voltage VSS line and includes a gate connected to the gate of the fourth bias transistor M10'.

Each of the first output transistor M12' and the second output transistor M13' can be a PMOS transistor. The first output transistor M12' is connected between the fifth node N5 and the power voltage VDD line and includes a gate connected to any one of the output ports of the first differential transistors M1' and M2'. The second output transistor M13' is connected between the sixth node N6 and the power voltage VDD line and includes a gate connected to the gate of the first output transistor M12'.

The output signals Vout+ and Vout− of each of the amplification units 110 shown in FIGS. 1, 5, and 6 are fed to the CMFB block 120 as inputs to transistors M2' and M6'. The reference voltage Vref is a predetermined common mode voltage.

When each of voltages of the signals Vout+ and Vout− fed as inputs to transistors M2' and M6' is larger than the reference voltage Vref, the current I12' flowing between the source and drain of the first output transistor M12' and the current I13' flowing between the source and drain of the second output transistor M13' both decrease. Thus, each of the voltages of the fifth node N5 and the sixth node N6 decreases. As a result, the CMFB block 120 maintains constant the output common mode voltage of each of the circuits 112 and 110 of FIGS. 2, 5, and 6.

Figure 10:
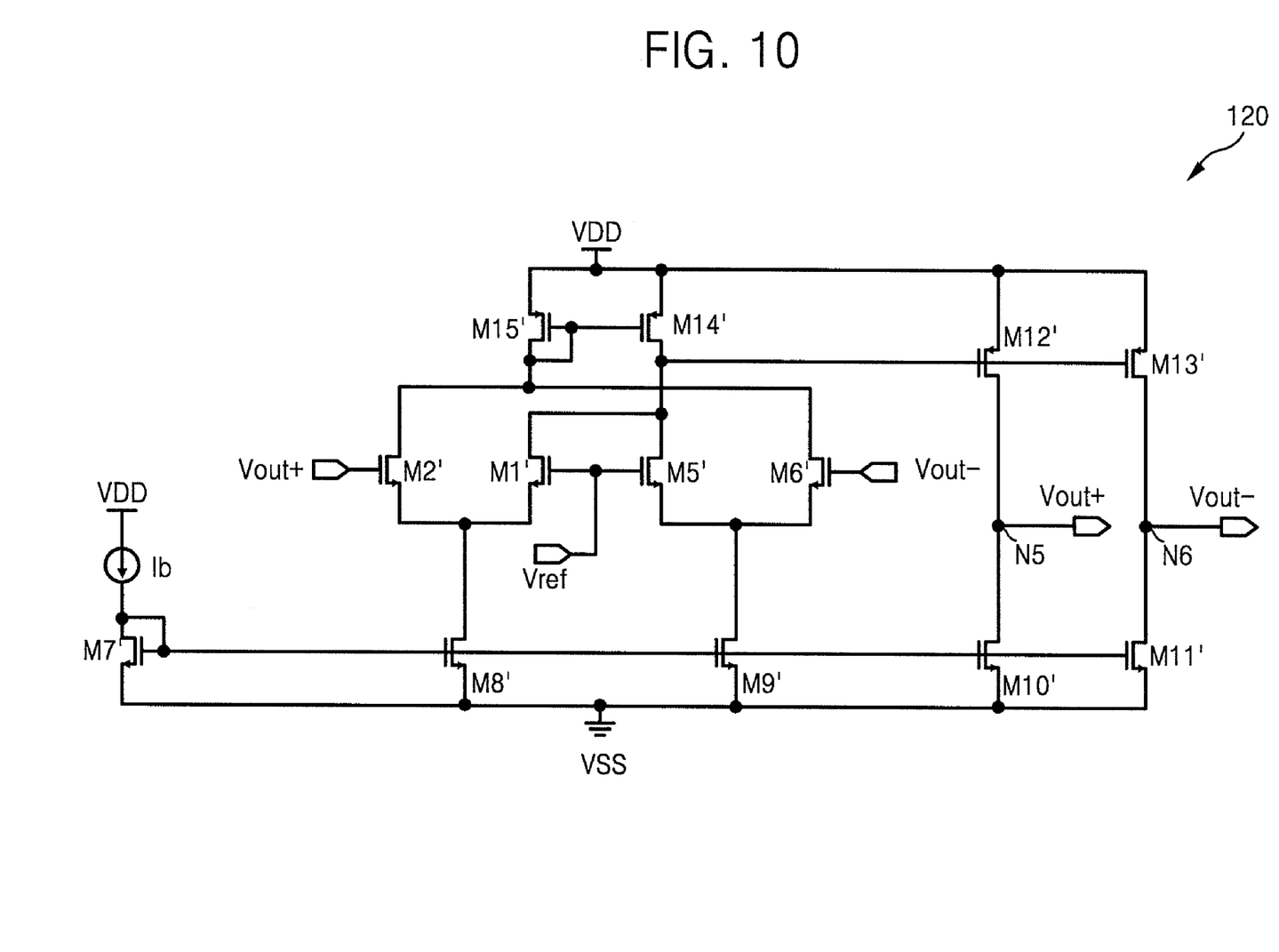
FIG. 10 is another exemplary embodiment of the CMFB block illustrated in FIG. 1.

FIG. 10 is another exemplary embodiment of the CMFB block used in the amplifier 100 shown in FIG. 1. Referring to FIG. 10, the CMFB block 120 of FIG. 10 includes current mirror type loads M14' and M15' instead of the first load transistor M3' and the second load transistor M4'.

A DC gain of a differential amplification unit including the current mirror type loads M14' and M15' of FIG. 10 is larger than that of the differential amplification unit including the pair of transistor loads M3' and M4' as shown in FIG. 9. Thus, the CMFB of FIG. 10 can generate the output common mode voltage closer to the reference voltage Vref compared to the CMFB as shown in FIG. 9.

As described above, the fully differential amplifier according to exemplary embodiments of the present invention takes a small area using the two stage amplifier, can perform a low voltage operation, and can provide a high slew rate and a high gain.

While this invention has been particularly shown and described with reference to exemplary embodiments thereof, it will be understood by those of ordinary in the art that various changes in form and details may be made therein without departing from the spirit and scope of the invention, as defined by the appended claims.

What is claimed is:

1. A fully differential amplifier comprising:
   a first single-ended current mirror type fully differential amplifier outputting a first output signal by two stage amplifying a difference between a first input signal and a second input signal; and
   a second single-ended current mirror type fully differential amplifier outputting a second output signal by two stage amplifying a difference between the first input signal and the second input signal,
   wherein a first tail of the first single-ended current mirror type fully differential amplifier and a second tail of the second single-ended current mirror type fully differential amplifier are connected to each other and the first output signal and the second output signal are differential signals, and further comprising a bias control circuit controlling a slew rate of each of the first output signal and the second output signal by controlling an amount of a tail current of the first tail during an amplification operation.

2. The fully differential amplifier of claim 1, wherein the bias control circuit controls the amount of the tail current based on currents obtained by mirroring each of a current flowing in a current mirror of the first single ended current mirror type fully differential amplifier and a current flowing in a current mirror of the second single ended current mirror type fully differential amplifier, by a real number multiple.

3. The fully differential amplifier of claim 2, further comprising a common mode feedback circuit that controls a common mode voltage of the fully differential amplifier based on results of amplifications of differences between a reference voltage and each of the first and second output signals.

4. A fully differential amplifier comprising:
   a first single-ended current mirror type fully differential amplifier outputting a first output signal by two stage amplifying a difference between a first input signal and a second input signal; and
   a second single-ended current mirror type fully differential amplifier outputting a second output signal by two stage amplifying a difference between the first input signal and the second input signal,
   wherein a first tail of the first single-ended current mirror type fully differential amplifier and a second tail of the second single-ended current mirror type fully differential amplifier are connected to each other and the first output signal and the second output signal are differential signals, wherein each of the first and second single-ended current mirror type fully differential amplifier comprises:
   a single-ended current mirror type differential amplification unit to amplify a difference between the first input signal and the second input signal; and
   a push-pull type amplification unit connected to an output port of the single-ended current mirror type differential amplification unit and outputting any one of the first and second output signals.

5. The fully differential amplifier of claim 4, wherein the push-pull type amplification unit comprises:
   a first transistor of a first conductive type connected between a power voltage line and an output port of the fully differential amplifier and having a gate connected to the output port of the single ended current mirror type differential amplification unit;
   a second transistor of a second conductive type connected between a ground voltage line and the output port of the fully differential amplifier;
   a third transistor of the second conductive type connected between a first node and the ground voltage line and including a gate connected to a drain and a gate of the second transistor;
   a fourth transistor of the first conductive type connected between the power voltage line and the first node and including a gate connected to a gate of a current mirror of the single ended current mirror type differential amplification unit; and
   a compensation capacitor connected between the output port of the single ended current mirror type differential amplification unit and the output port of the fully differential amplifier.

6. The fully differential amplifier of claim 5, wherein the push-pull type amplification unit further comprises a fifth transistor of the second conductive type that is connected between the first tail and the ground voltage line and including a gate connected to a gate of the third transistor of the second conductive type, and the third transistor of the second conductive type and the fifth transistor of the second conductive type form a current minor having a current ratio of a real number.

7. A method for performing a class AB differential amplification, the method comprising:
    differentially amplifying a difference between a first input signal and a second input signal through a pair of single ended current mirror type amplifiers respectively having tails connected to each other in parallel, and outputting a first signal and a second signal that is a differential signal of the first signal; and
    outputting a first output signal by amplifying the first signal through a first push-pull up amplification circuit, and outputting a second output signal that is a differential signal of the first output signal by amplifying the second signal through a second push-pull up amplification circuit.

8. The method of claim 7, further comprising controlling a slew rate of each of the first output signal and the second output signal by controlling an amount of a tail current during an amplification operation.

9. The method of claim 8, wherein, in the controlling of the slew rate, the amount of the tall current is controlled based on currents obtained by mirroring each current flowing in each of the current mirror type amplifiers of the single ended current mirror type fully differential amplifiers, by a real number of times.

10. The method of claim 8, further comprising controlling a common mode voltage based on results of amplification of a difference between each of the first and second output signals and a reference voltage.

* * * * *